(12) United States Patent
Shibata et al.

(10) Patent No.: US 6,623,877 B2
(45) Date of Patent: Sep. 23, 2003

(54) III NITRIDE EPITAXIAL WAFER AND USAGE OF THE SAME

(75) Inventors: Tomohiko Shibata, Kasugai (JP); Yukinori Nakamura, Nagoya (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/962,932

(22) Filed: Sep. 25, 2001

(65) Prior Publication Data

US 2002/0058162 A1 May 16, 2002

(30) Foreign Application Priority Data

Oct. 13, 2000 (JP) ........................................ 2000-313070
Sep. 4, 2001 (JP) ........................................ 2001-266804

(51) Int. Cl.[7] ............................ B32B 9/00; H01L 33/00; C30B 29/38
(52) U.S. Cl. ........................ 428/698; 428/697; 428/699; 428/702
(58) Field of Search ................................ 428/689, 697, 428/698, 446, 701, 702, 699; 257/103, 183, 200, 201

(56) References Cited

U.S. PATENT DOCUMENTS 5,751,013 A * 5/1998 Kidoguchi et al. ............ 257/13
6,064,078 A * 5/2000 Northrup et al. .............. 257/96
6,342,748 B1 * 1/2002 Nakamura et al. ........... 310/313

OTHER PUBLICATIONS

U.S. patent application Ser. No. 09/962,921, Shibata et al., filed Sep. 25, 2001.

* cited by examiner

Primary Examiner—Deborah Jones
Assistant Examiner—Stephen Stein
(74) Attorney, Agent, or Firm—Burr & Brown

(57) ABSTRACT

An epitaxial wafer includes a base material made of sapphire-SiC single crystal or the like, a III nitride underfilm including at least Al epitaxially grown on the base material and a GaN film, preferably having a thickness of 50 Å or more, formed on the underfilm. In fabricating III nitride films on the epitaxial wafer, the oxidized surface layer of the GaN film is removed through an etching process, and subsequently, another III nitride film is formed thereon.

10 Claims, No Drawings

III NITRIDE EPITAXIAL WAFER AND USAGE OF THE SAME

BACKGROUND OF THE INVENTION (1) Field of the Invention

This invention relates to a III nitride epitaxial wafer and the usage of the same, particularly to a III nitride epitaxial wafer and the usage of the same preferably usable for a substrate of semiconductor devices such as a light-emitting diode or a high speed IC chip.

(2) Related Art Statement

III nitride films are used as semiconductor films for light-emitting diodes, and recently get attention as semiconductor films for high speed IC chips. Particularly, Al-including III nitride films get attention as field emitter materials.

Such III nitride films are formed on an epitaxial wafer, for example, which has an underfilm epitaxially grown on a given base material. The underfilm is preferably made of Al-including III nitride films in order to facilitate the epitaxial growth of the III nitride films to be formed. Moreover, such Al-including III nitride films formed between the base material and the III nitride films can enhance the efficiency of a semiconductor element because of a wider bandgap of Al-including III nitride material.

The epitaxial wafer is set on a susceptor installed in a given reactor, and heated to a predetermined temperature with a heater built in or out of the susceptor. Then, a raw material for a III metal, nitrogen and, if necessary, other elements are introduced into the reactor with carrier gases, and supplied onto the epitaxial wafer to fabricate the III nitride films by an MOCVD method.

However, the fabrication process of the epitaxial wafer is carried out in a different apparatus from the one where the above-mentioned fabrication process of the III nitride films is done, partly because the fabrication condition of the epitaxial wafer is different from the fabrication condition of the III nitride films. Therefore, the epitaxial wafer is exposed to the environmental atmosphere after the fabrication process of the epitaxial wafer. Moreover, there is a problem with damages forming at the surface of the epitaxial wafer when characterizing the epitaxial wafer.

Then, the surface of an Al-including III nitride underfilm of the epitaxial wafer is oxidized and/or comes to include some defects. As a result, the III nitride films can not have good crystal quality due to the bad condition of the epitaxial wafer surface.

From this point of view, such an attempt was made that an Al-including III nitride films as an underfilm is formed thicker on a base material, and the oxidized surface layer of the underfilm is removed. However, the oxidized surface layer including Al can not be removed by hydrogen gas or ammonia gas, which are used in the fabrication of a III nitride films, and accordingly, another etching apparatus are required. As a result, the whole fabrication process becomes complicated, and the operationality and the yield ratio are deteriorated.

SUMMARY OF THE INVENTION

It is an object of the present invention to prevent the oxidization of an under film made of an Al-including III nitride film of an epitaxial wafer, and to the usage of the epitaxial wafer having an underfilm that is not oxidized.

In order to achieve the above object, this invention relates to an epitaxial wafer comprising a base material made of a single crystal material, a III nitride underfilm including at least Al epitaxially grown on the base material, and an $In_aGa_bN$ (a+b=1) film formed on the underfilm.

This invention also relates an epitaxial wafer including a base material made of a single crystal material, a III nitride underfilm including at least more than 50 atomic percentages-Al element epitaxially grown on the base material, and an $In_aGa_bN$ (a+b=1) film formed on the underfilm.

The oxidized surface layer of the $In_aGa_bN$ film is removed through an etching process, and a III nitride film is formed on the $In_aGa_bN$ film, in which the thickness of the epitaxial wafer has been reduced subsequent to the etching process.

The inventors intensely studied ways to prevent the oxidization of the Al-including III nitride underfilm. As a result, they discovered that a protective film should be fabricated on the underfilm. However, it was required that the protective film did not obstruct the epitaxial growth of the III nitride films, and the oxidized surface layer of the protective layer needed to be easily removed. Accordingly, it is very difficult to match suitable materials to the protective film.

Then, the inventors made enormous research and development to discover suitable materials for the protective film. As a result, the inventors discovered that if the protective film is made of an $In_aGa_bN$ film (a+b=1), the epitaxial growth of the III nitride film is not obstructed and the oxidized surface layer of the protective film can be easily removed by an etching process using hydrogen gas and/or ammonia gas, which are used in the fabrication process of the III nitride films.

The $In_aGa_bN$ film functions as an underfilm for the III nitride films as well as the protective film to be formed. Therefore, the $In_aGa_bN$ film can be fabricated on the similar condition to the one of the Al-including III nitride underfilm. Therefore, both of the $In_aGa_bN$ film and the Al-including III nitride underfilm can be made by the same apparatus, so that the whole fabrication process can be simplified.

On the above-mentioned enormous research and development, the inventors found out that the $In_aGa_bN$ film is extremely suitable for the Al-including III nitride underfilm, and attained the epitaxial wafer and the usage of the substrate according to the present invention.

Herein, the Al-including III nitride underfilm is constructed, as occasion demands, of a single layer, a multi-layered structure or a composition-gradient film in which the composition of a given element is inclined in its thickness direction. Therefore, the Al content of the Al-including III nitride underfilm means the one over the underfilm structure.

The $In_aGa_bN$ film may contain inevitably, in addition to In, Ga and nitrogen, H, O, C, Al, Si, Ge, Mg, Zn, Be or the like, depending on the film-forming condition, the raw materials or the reactor materials.

Moreover, the $In_aGa_bN$ film may be entirely removed for simplifying the etching process, instead of removing the oxidized surface layer of the $In_aGa_bN$ film. The etching process for the $In_aGa_bN$ film does not influence the properties of the III nitride film to be formed on the epitaxial wafer.

DESCRIPTION OF THE PREFERRED EMBODIMENTS

This invention will be described in detail, hereinafter.

The epitaxial wafer is required to have the $In_aGa_bN$ film on the Al-including III nitride underfilm. The $In_aGa_bN$ film can be made under similar conditions and with the same apparatus used for forming the Al-including III nitride underfilm, as mentioned above. For example, trimethylgallium as a raw material for Ga and ammonia gas as a raw material for nitrogen are supplied on the base material of the epitaxial wafer heated to 1050° C. to fabricate the $In_aGa_bN$ film.

Although the thickness of the $In_aGa_bN$ film is not restricted, it may be preferably set to 50 Å or more, particularly 100 Å or more. As the result of the detailed investigation for the oxidization mechanism of the $In_aGa_bN$ film, the oxidization proceeds to a depth of about 50 Å from the surface of the $In_aGa_bN$ film at the maximum case. Therefore, if the thickness of the $In_aGa_bN$ film is set within the above-mentioned thickness range, the Al-including III nitride underfilm positioned under the $In_aGa_bN$ film is not substantially oxidized.

Although the upper limit thickness of the $In_aGa_bN$ film is not particularly restricted, it may be preferably set to about 1 $\mu$m or below. If the $In_aGa_bN$ film is fabricated thicker than 1 $\mu$m, the properties of the epitaxial wafer can not be improved, and instead, some cracks and exfoliation are created in the film due to the stress in the grown film.

The $In_aGa_bN$ film is preferably a GaN film. In this case, the protective effect for the Al-including III nitride underfilm can be enhanced.

It is required that the Al-including underfilm includes at least Al element, preferably Al content of 50 atomic percentages or more, for the enhancement of the efficiency of a semiconductor element, including the epitaxial wafer and the III nitride film. The surface oxidization of the underfilm is caused mainly due to the Al element of the underfilm. Therefore, although the underfilm having a large Al content suffers from the surface oxidization conspicuously by nature, the real surface oxidization can be repressed by the protective film made of the $In_aGa_bN$ film.

Although the thickness of the Al-including III nitride underfilm depends on the kind and the crystal quality of the III nitride film to be formed, it is preferably set to 0.5 $\mu$m or over, particularly within 1–3 $\mu$m. For the enhancement of the crystal quality of the III nitride film to be formed, it is desired that the underfilm is formed thicker, but if the thickness of the underfilm is beyond 3 $\mu$m, some cracks and exfoliation are created in the underfilm.

In the case of fabricating a light-emitting diode or the like, some semiconductor films having their respective compositions of $Al_dGa_eIn_fN$ (d+e+f=1) are formed on the epitaxial wafer. In this case, therefore, it is desired that the Al-including III nitride underfilm has the similar composition of $Al_xGa_yIn_zN$ (X+y+Z=1, X≧0.5), particularly $Al_xGa_yIn_zN$ (X+y+Z=1, X≧0.7). More particularly, the underfilm is constructed of an AlN film. Thereby, the epitaxial growth of the III nitride film to be formed on the underfilm is much developed, and thus, the crystal quality of the film can be more enhanced.

As mentioned above, if the underfilm includes a large Al content, the surface oxidization of the underfilm can be repressed by the protective film made of the $In_aGa_bN$ film according to the present invention.

The Al-including III nitride underfilm may contain B, Si, Ge, Zn, Be, Mg or the like. Moreover, the underfilm may contain inevitable minute amounts of other elements and minute impurities depending on the film-forming condition, the raw materials and the reactor material, in addition to the above-mentioned intentional elements.

The base material of the epitaxial wafer is not restricted. As the base material, there are exemplified oxide single crystals such as sapphire single crystal, ZnO single crystal, $LiAlO_2$ single crystal, $LiGaO_2$ single crystal, $MgAl_2O_4$ single crystal, or MgO single crystal, IV single crystal or IV-IV single crystal such as Si single crystal or SiC single crystal, III-V single crystal such as GaAs single crystal, AlN single crystal, GaN single crystal or AlGaN single crystal, and boride single crystal such as $Zr_2B_2$.

Particularly, sapphire-SiC single crystal is preferably employed because the base material made of the single crystal can have good physical compatibility for the III nitride underfilm having a larger Al content, and thus, provide good contact and epitaxial growth property to the underfilm.

In using the sapphire single crystal, it is desired that the main surface of the sapphire single crystal, onto which the Al-including III nitride underfilm is formed, is nitrided. In this case, a surface nitride layer is formed at the main surface, and thus, the crystal quality of the Al-including III nitride underfilm can be enhanced through the surface nitride layer. As a result, the crystal quality of the III nitride films to be formed having, e.g., a composition of $Al_dGa_eIn_fN$ (d+e+f=1) can be enhanced.

Moreover, if the Al-including III nitride underfilm is formed thicker on the main surface via the surface nitride layer, some cracks and exfoliation is not substantially created in the underfilm. Therefore, depending on the film-forming condition, the underfilm can be formed as thick as 3 $\mu$m or so. Therefore, on the multiplier effect of the enhancement of the crystal quality of the underfilm due to the surface nitride layer and the thickness increase, the crystal quality of the underfilm itself can be much enhanced, and thus, the crystal quality of the III nitride film to be formed on the underfilm can be more enhanced.

The above nitriding treatment can be performed by setting the sapphire single crystal in a nitrogen-containing atmosphere such as ammonia gas atmosphere and then, heating the single crystal for a given period. The thickness of the surface nitride layer depends on the nitrogen concentration, the nitriding temperature and the nitriding period. It is desired that the thickness of the surface nitride layer is set to 1 nm or below, or as thick as the nitrogen concentration of the layer is 2 atomic percentages or over at a depth of 1 nm from the main surface of the sapphire single crystal to be nitrided.

In use of the thus obtained epitaxial wafer, the oxidized surface layer of the top $In_aGa_bN$ film is etched and removed by a general-purpose dry-etching or wet etching.

Since the whole fabrication process of the III nitride films can be simplified, the oxidized surface layer is preferably removed by the dry-etching.

In the dry etching, a given etching gas is introduced into the reactor, and supplied onto the epitaxial wafer heated to 900° C. or over. Then, the oxidized surface layer is removed by the heated and/or resolved etching gas.

It is desired that hydrogen gas as a carrier gas or ammonia gas as a nitrogen supply source, which are used in the fabrication process of the III nitride films, is employed as the etching gas because the oxidized surface layer can be easily removed by such an etching gas. In this case, another chorine-based corrosion gas or the like is not required, so that the III nitride film is never corroded by such a corrosion gas in the fabrication process.

EXAMPLES

This invention will be concretely described hereinafter. In the Examples, the crystal quality of a lastly obtained GaN film is evaluated by the defect density from the number of dot-like abnormal growth portions having a 1 µm or more size.

Example 1

A sapphire-SiC single crystal base material was employed, and then, set and attracted on a susceptor installed in a quartz reactor. Thereafter, the base material was heated to 1200° C. with the heater built in the susceptor.

Then, trimethylaluminum as a raw material for Al and ammonia gas as a raw material for nitrogen was employed, and introduced into the reactor at a flow rate ratio of $NH_3/TMA=500$ with hydrogen carrier gas and supplied onto the base material to form an AlN underfilm in a 1 µm thickness on the base material. Herein, the flow rate of $NH_3$ and TMA were adjusted appropriately in the above flow rate ratio and within a given film-forming rate range.

Then, the base material was cool down to 1050° C., and trimethylgallium (TMG) as a raw material for Ga and ammonia gas were introduced into the reactor at a flow rate ratio of $NH_3/TMG=5000$ with hydrogen carrier gas and supplied onto the AlN underfilm to form a GaN film in a 100 Å thickness, thereby to complete an epitaxial wafer.

Thereafter, the epitaxial wafer was set in a susceptor installed in another reactor. Ammonia gas was supplied on the epitaxial wafer with hydrogen carrier gas at a flow rate of 1000 sccm and the epitaxial wafer was heated to 900° C. with the heater built in the susceptor, thereby to remove surface layer of the substrate through the 10 minutes-etching.

Then, the epitaxial wafer is heated to 1050° C. with the heater. Subsequently, trimethylgallium (TMG) as a Ga supply source and ammonia gas as a nitrogen supply source were introduced into the reactor at a flow rate ratio of $NH_3/TMG=5000$ with hydrogen and nitrogen carrier gas, and supplied onto the epitaxial wafer, thereby to form a GaN film with a 1 µm thickness.

When the defect density of the GaN film was measured, it was $0.1/mm^2$.

Example 2

A C-faced sapphire single crystal base material was employed instead of the sapphire-SiC single crystal base material, and then, set and attracted on a susceptor installed in a quartz reactor. Thereafter, the base material was heated to 1200° C. with the heater built in the susceptor.

Then, ammonia gas ($NH_3$) was flown with hydrogen carrier gas for five minutes to nitride the main surface of the base material. From ESCA analysis, it was turned out that a nitride layer is formed at the main surface through the nitriding treatment and the nitrogen concentration of the nitride layer is 7 atomic percentages at a 1 nm depth from the main surface.

Then, the 1 µm thickness AlN underfilm was formed and subsequently, the 100 Å thickness GaN film was formed on the underfilm in the same manner as Example 1, to complete an epitaxial wafer. The surface layer of the GaN film was removed through the same etching process as in Example 1, and the 1 µm GaN film was formed on the reduced film of the epitaxial wafer.

When the defect density of the GaN film was measured, it was $0.01/mm^2$ or below.

In the above Examples, although the GaN film was formed on the epitaxial wafer, a desired AlGaInN film can be formed by controlling appropriately the III organic metal supply amount, the ammonia supply amount, the film-forming rate, the carrier gas flow rate and the film-forming pressure.

Comparative Example

Without the 100 Å GaN film, an epitaxial wafer was made of the sapphire-SiC single crystal base material and the 1 µm thickness AlN underfilm, and then, the 1 µm thickness GaN film was formed on the epitaxial wafer in the same manner in Example 1. When the defect density of the GaN film was measured, it was $100/mm^2$.

As is apparent from Examples and Comparative Example, the 1µ thickness GaN film formed on the epitaxial wafer having the 100 Å GaN film on the AlN underfilm can have good crystal quality. That is, it is turned out that according to the epitaxial wafer and the usage of the substrate, the GaN film having good crystal quality can be provided.

Although the present invention was described in detail with reference to the above examples, this invention is not limited to the above disclosure and variations and modifications may be made without departing from the scope of the present invention. For example, a buffer layer or a multi-layered structure, such as a distorted superlattice structure, may be provided between the GaN film and the epitaxial wafer. Moreover, the crystal quality of the GaN film may be more enhanced by employing multi-stage growth conditions.

As mentioned above, according to the present invention, the III nitride film to be formed does not suffer from the oxidization layer and the surface defects of the epitaxial wafer, and thus, the crystal quality of the film can be enhanced.

What is claimed is:

1. An epitaxial wafer comprising a single crystal base material having an upper nitrified surface, a III nitride underfilm including at least Al epitaxially grown on the upper surface of the base material, and an $In_aGa_bN$ (a+b=1) film formed on the underfilm.

2. An epitaxial wafer as defined in claim 1, wherein the thickness of the $In_aGa_bN$ film is at least 50 Å.

3. An epitaxial wafer as defined in claim 1, wherein the $In_aGa_bN$ film is a GaN film.

4. An epitaxial wafer as defined in claim 1, wherein the Al content of the III nitride underfilm comprises at least 50 atomic percentage.

5. An epitaxial wafer as defined in claim 4, wherein the III nitride underfilm has a composition of $Al_xGa_yIn_zN$ (x+y+z=1, x≧0.7).

6. An epitaxial wafer as defined in claim 5, wherein the III nitride underfilm is an AlN film.

7. An epitaxial wafer as defined in claim 1, wherein the base material comprises any one of sapphire single crystal and SiC single crystal.

8. An epitaxial wafer as defined in claim 1, wherein the base material comprises sapphire single crystal.

9. An epitaxial wafer, comprising:
a single crystal base material having an upper nitrified surface;
a III nitride underfilm epitaxially grown on the upper surface of the base material, the III nitride underfilm including at least Al;
an $In_aGa_bN$ (a+b=1) film formed on the III nitride underfilm; and
a III nitride film formed on the $In_aGa_bN$ film, wherein an oxidized surface layer of the $In_aGa_bN$ film is removed through an etching process such that the thickness of the $In_aGa_bN$ film is reduced.

10. The epitaxial wafer as defined in claim 9, wherein the oxidized surface layer of the $In_aGa_bN$ film is removed by using at least one of hydrogen gas and ammonia gas.

* * * * *